United States Patent [19]
Nishigaki et al.

[11] Patent Number: 5,261,407
[45] Date of Patent: Nov. 16, 1993

[54] ULTRASONIC DOPPLER BLOOD-FLOW METER

[75] Inventors: Mori Nishigaki, Kawasaki; Hiroshi Fukukita, Tokyo; Hisashi Hagiwara; Junichiro Ninomiya, both of Yokohama, all of Japan

[73] Assignee: Matsushita Electric Industrial Co., Ltd., Kadoma, Japan

[21] Appl. No.: 796,596

[22] Filed: Nov. 22, 1991

[30] Foreign Application Priority Data

Nov. 30, 1990 [JP] Japan .................. 2-338225
Sep. 24, 1991 [JP] Japan .................. 3-243068

[51] Int. Cl.⁵ .................................. A61B 8/06
[52] U.S. Cl. ................ 128/660.05; 128/661.09
[58] Field of Search ............ 128/660.05, 661.09; 73/861.25

[56] References Cited

U.S. PATENT DOCUMENTS

| | | |
|---|---|---|
| 4,541,437 | 9/1985 | Amemiya .............. 128/661.09 |
| 4,593,700 | 6/1986 | Hayakawa et al. ........ 128/661.09 |
| 4,966,153 | 10/1990 | Nakamura et al. ........ 128/661.09 |

FOREIGN PATENT DOCUMENTS 0202920 11/1986 European Pat. Off. .
56-106158 11/1981 Japan .
2097533 11/1982 United Kingdom .

Primary Examiner—Francis Jaworski
Attorney, Agent, or Firm—Spencer, Frank & Schneider

[57] ABSTRACT

There is provided an ultrasonic Doppler blood-flow meter which can suppress the occurrence of unwanted frequency components by suppressing the jump of signal to thereby produce images of high quality A DC feedback circuit is provided which negatively feeds back a Doppler deviated signal produced from an integrator to the input thereof. The feedback amount of the DC feedback circuit is changed in synchronism with the timing for switching between the B-mode transmission/reception sequence and the Doppler mode sequence to prevent a jump of a signal at the commencement of the Doppler mode. The feedback amount of the DC feedback circuit is made to be different for the gate moving sequence and the Doppler mode sequence, thereby preventing a jump of a transient signal due to a discontinuous input signal at the commencement of the Doppler mode.

10 Claims, 14 Drawing Sheets

ULTRASONIC DOPPLER BLOOD-FLOW METER

BACKGROUND OF THE INVENTION

The present invention relates to an ultrasonic Doppler blood-flow meter used in the medical field and capable of simultaneously displaying data of a desired blood-stream in a living body and a B-mode diagnostic image in real time.

In recent years, the ultrasonic Doppler blood-flow meter has found its widespread use in the medical field including diagnoses of the cardiology and the vascular organ. The ultrasonic Doppler blood-flow meter utilizes a phenomenon that an ultrasonic pulse signal transmitted into a living body undergoes a frequency deviation due to the Doppler effect occurring when the pulse signal is reflected by a moving object such as a blood stream and it is so constructed as to measure a speed of the blood stream acting as a reflector by detecting a Doppler deviated frequency and to permit easy observation, from the body surface, of a blood stream speed distribution in the living body by displaying a result of the measurement. Conventional ultrasonic Doppler blood-flow meters will now be described with reference to the accompanying drawings.

FIG. 1 is a functional block diagram showing a conventional ultrasonic Doppler blood-flow meter. Referring to FIG. 1, a probe 1 converts a pulse signal into an ultrasonic pulse signal, transmits the ultrasonic pulse signal into a living body 14 and converts an ultrasonic wave reflected and received from the inside of the living body into an electrical signal. A drive circuit 2 transmits the pulse signal to the probe 1 to drive it. A transmission timing circuit 3 generates a timing signal for the drive circuit 2 to generate pulses. A receiving circuit 4 amplifies an echo signal received from the probe 1. A phase detector 5 performs phase detection of the echo signal delivered from the receiving circuit by using reference signals. A reference signal generation circuit 6 generates a reference signal to which frequency and phase of the reference signals used for the phase detection in the phase detector 5 are referenced. A gate signal generation circuit 7 generates a gate signal during an interval of time corresponding to a propagation time required for the ultrasonic wave to propagate between the transmitting/receiving surface of the probe 1 and a portion to be examined Analog switches 8a and 8b enable phase-detected signals from the phase detector 5 to be passed during only an interval or duration of the gate signal generated by the gate signal generation circuit 7. Integrators 9a and 9b integrate the phase-detected signals having passed through the analog switches 8a and 8b to determine the summation of the phase-detected signals Accordingly, by repeating transmission/reception of the ultrasonic pulse signal, a Doppler deviated signal can be obtained. Sample-and-hold circuits 10a and 10b hold a result of an integral operation until a result of the next integral operation is obtained, in order to permit resetting to be done before the integrators 9a and 9b perform integral operations. High-pass filters 11a and 11b remove a signal component of less than several of tens of Hz or several of hundreds of Hz, that is, a clutter component from the Doppler deviated signals produced by the integrators 9a and 9b. A frequency analyzer 12 analyzes the frequency of the Doppler deviated signals passed through the high-pass filters 1a and 11b. A display unit 13 displays results of frequency analysis.

The above construction will now be described in greater detail by referring to the operation thereof.

An electrical pulse signal generated by the drive circuit 2 using a timing signal generated from the transmission timing circuit 3 as a trigger is converted by the probe 1 into an ultrasonic pulse signal which in turn is transmitted into the living body 14 acting as an object to be examined. The ultrasonic pulse signal propagates within the living body and it is reflected at a portion at which the acoustic impedance changes to reach the probe 1 and converted into an electric signal. The thus obtained echo signal is amplified by the receiving circuit 4 to a suitable extent and then applied to the phase detector 5 so as to undergo phase detection. Reference signals for phase detection generated from the reference signal generation circuit 6 are two signals Vx and Vy being in synchronism with a timing signal of the transmission timing circuit 3 and degrees dephased mutually. These signals are 90 indicated by the following equations (1) and (2):

$$Vx = \cos wt \quad \quad \quad \quad (1)$$

$$Vy = \sin wt \quad \quad \quad \quad (2)$$

The echo signal, E, is indicated by the following equation $$E = A\cos w(1+\alpha)t \quad \quad \quad (3)$$

where A is echo intensity and $\alpha$ is frequency shift coefficient. In the phase detector 5, E in equation (3) is multiplied with each of the signals Vx and Vy in equations (1) and (2) and there result the following equations (4) and (5):

$$E \cdot Vx = \frac{A}{2} \cdot \cos\alpha wt + \frac{A}{2} \cdot \cos(2+\alpha)wt \quad (4)$$

$$E \cdot Vy = \frac{A}{2} \cdot \sin\alpha wt + \frac{A}{2} \cdot \sin(2+\alpha)wt. \quad (5)$$

In the right side of equations (4) and (5), the first term is of a low frequency of about several of kHz or less and the second term is of a high frequency of several of MHz. Accordingly, when the analog switches 8a and 8b are turned on during only a sampling volume obtained from these signals and signals confined within this interval are integrated by the integrators 9a and 9b, the second term are extinguished and a value of the first term which is proportional to a deviation at an instant can be obtained. The data is held by the sample-and-hold circuits 10a and 10b so that a stepped signal representative of a discrete-time Doppler deviated signal is obtained.

The thus obtained Doppler deviated signal contains blood flow data and a component called a clutter as well which is due to an echo from a tissue of living body such as a vascular wall, the clutter component being as large as about 40 dB of the blood flow component. Therefore, for the sake of expanding the dynamic range of the frequency analyzer 12, elimination of the influence due to an echo from a living body tissue is of significance. The frequency of Doppler deviated signal of the echo from living body tissue is in general several of tens of Hz or less and is lower than that of the blood flow component. Therefore, by removing low frequencies by means of the high-pass filters 11a and 11b, the influence of the echo from living body tissue can be eliminated. The thus obtained Doppler deviated signal is subjected to frequency conversion by means of the frequency analyzer 12 and then displayed on the display unit 13.

From the standpoint of the dynamic range of the integrators 9a and 9b, however, the integrators 9a and 9b are applied with the coexistence of a strong Doppler deviated signal due to the echo from living body tissue and a weak Doppler deviated signal due to the blood flow and therefore, when the weak Doppler deviated signal due to the blood flow is amplified at a large gain, the integrators 9a and 9b are inconveniently saturated by the Doppler deviated signal stemming from the living body tissue. When saturated, the Doppler deviated signal of blood flow at that portion are extinguished and in addition, the waveform is distorted to generate unwanted frequency components. To cope with such a problem, a construction as described in, for example, JP-A-61-265131 and JP-A-62-155836 has been proposed. This prior art is illustrated in a functional block diagram of FIG. 2 of the accompanying drawings and as shown, it structurally differs from the conventional example shown in FIG. 1 by the provision of DC feedback circuits 15a and 15b for feeding back the output signals of the sample-and-hold circuits 10a and 10b to the inputs of the analog switches 8a and 8b.

FIG. 3 shows an example of a specific circuit arrangement of the analog switch 8a or 8b, integrator 9a or 9b, DC feed back circuit 15a or 15b and sample-and-hold circuit 10a or 10b. As is clear from FIG. 2, two channels of this circuit arrangement are needed. The integrator 9a or 9b includes a resistor (R1) 101, a capacitor (Co) 102, an operational amplifier (OP1) 103 and an analog switch 104 and the DC feedback circuit 15a or 15b includes a resistor (R2) 105, a resistor (Rf) 106, a capacitor (Cf) 107, an operational amplifier (OP2) 108 and an analog switch 109. Denoted by 110 is a feedback gain control circuit. The sample-and-hold circuit 10a or 10b has the function to amplify at a gain of −A times.

With the above construction, the operation will now be described with reference to a timing chart of FIG. 4.

A signal subjected to phase detection by means of the phase detector 5 in a similar manner to that in the foregoing conventional example is passed through the analog switch 8a or 8b which is turned on during a gate interval t1−t2 and stored in the capacitor 102 of the integrator 9a or 9b. Since the analog switch 104 is turned on by a RESET signal in advance of the gate interval, a value resulting from integral during only the gate interval is obtained. When the gate interval ends, the integrated value of the integrator 9a or 9b is held in the sample-and-hold circuit 10a or 10b and at the same time −A times amplified thereby and then applied to the DC feedback circuit 15a or 15b through the analog switch 109. On-time tf of the analog switch 09 is determined in accordance with a cut-off frequency fc of the entire circuitry of FIG. 3.

The DC feedback circuit 15a or 15b is an integrator, namely, a kind of low-pass filter. The input signal to the DC feedback, circuit 15a or 15b is inverted in phase by being −A times amplified by means of the sample-and-hold circuit 10a or 10b and therefore the output signal from the DC feedback circuit 15a or 15b corresponds to a phase inversion of a DC component and an extremely low-frequency component of the output signal of the integrator 9a or 9b. Since the output signal of the DC feedback circuit 15a or 15b is fed back to the input of the analog switch 8a or 8b, the fed back signal is inputted along with the phase detected signal to the integrator 9a or 9b when the analog switch 8a or 8b is turned on, to cancel out the DC component and extremely low-frequency component contained in the Doppler deviated signal. Through this operation, the entire circuitry of FIG. 3 acts as a high-pass filter having a cut-off frequency fc given by the following equation (6):

$$fc = \frac{\sqrt{2}}{2\pi} \frac{Atg \cdot tf}{CocfR_2RfT} \tag{6}$$

where $t_g = t_2 - t_1$.

As described above, by operating the circuit arrangement of FIG. 3, saturation of the integrators 9a and 9b due to the echo from living body tissue can be mitigated. In the foregoing example, the output signal of the sample-and-hold circuit 10a or 10b is applied to the DC feedback circuit 15a or 15b but similar results can be obtained by applying the output signal of the integrator 9a or 9b to the DC feedback circuit 15a or 15b.

Now, the principle of an ultrasonic Doppler blood-flow meter for simultaneously displaying both of a B-mode image and a Doppler spectrum in real time, which meter will hereinafter be referred to as a simultaneous Doppler type meter, will be described.

In the simultaneous Doppler type, sequence of switching between the B mode and the Doppler mode can be conceived in various ways but a scheme in which the sequence of the B mode and Doppler mode is alternately switched at each TX pulse, hereinafter called an alternate scheme, is generally employed. In the alternate scheme, however, the sampling interval of the Doppler deviated signal is doubled, raising a problem that the maximum blood flow speed measurable without aliasing is halved.

A different scheme from the alternate scheme has been contrived in which switching between the B mode and Doppler mode is effected at intervals of several of tens or several of hundreds of TX pulses. This latter scheme will hereinafter be called a chopper scheme. In the chopper scheme, the sampling interval remains unchanged but the Doppler spectrum is interrupted during the B-mode period and some compensation is needed.

In a conventional serial Doppler type based on the chopper scheme, the deficit of signal due to the B-mode sequence intervening between the preceding Doppler sequence and the succeeding Doppler sequence leads to the following problems.

FIG. 5 shows an example of output waveform of the sample-and-hold circuit in the simultaneous Doppler type based on the chopper scheme. The sample-and-hold circuit delivers an output signal as shown at E0 when the DC feedback circuit is not provided. This waveform contains a small-amplitude Doppler deviated signal of blood stream superposed on a large-amplitude Doppler deviated signal of living body tissue but its value is zero during B-mode period because of the absence of any input signal. As soon as the B mode switches to the Doppler mode, a Doppler signal develops, causing a large jump of signal at an instant of switching. In an output signal Eo of the sample-and-hold circuit delivered out thereof when the DC feedback circuit is provided, unwanted frequency components due to the jump of signal are generated.

Further, in many applications of the ultrasonic Doppler blood-flow meter, control of changing the gate position, gate width, amplitude of transmission pulse and mu-factor of receiving amplifier is carried out by placing the ultrasonic Doppler blood-flow meter in operated condition while monitoring the status of an object to be examined in living body. When the changing control is effected, however, discontinuity takes place between data before change and data after change. Specifically, when the gate position or gate width is changed, the position or magnitude of sample volume changes and when the transmission pulse output signal or mu-factor of receiving amplifier is changed, the amplitude of signal changes. In the presence of the thus occurring discontinuity of signal, unwanted frequency components are generated owing to the jump of signal taking place at the discontinuous plane.

In addition to the above, the Doppler signal abruptly develops when a freeze of the operation of the apparatus is released, and the resulting jump of signal gives rise to occurrence of unwanted frequency components.

SUMMARY OF THE INVENTION

The present invention intends to solve the conventional problems and it is an object of the invention to provide an ultrasonic Doppler blood-flow meter which can suppress the occurrence of unwanted frequency components by suppressing the jump of signal to thereby produce images of high quality.

To accomplish the above object, an ultrasonic Doppler blood-flow meter according to the invention comprises means for transmitting an ultrasonic pulse signal into a living body and receiving an echo signal reflected within the living body, phase detection means for detecting the phase of the echo signal, means for selecting a gate part of a phase-detected signal, an integrator for integrating the selected phase-detected signal, a DC feedback circuit for negatively feeding back a DC component and a low-frequency component contained in a Doppler deviated signal produced from the integrator to the input thereof, and control means for changing the feedback amount of the DC feedback circuit in synchronism with the timing for switching between the B-mode transmission/reception sequence and the Doppler mode sequence.

Control means is provided which, when the gate position, gate width, amplitude of transmission pulse or mu-factor of receiving circuit is changed, changes the feedback amount by which a Doppler deviated signal developing immediately after completion of the changing is negatively fed back by means of the DC feedback circuit, or which similarly changes the feedback amount of the DC feedback circuit immediately after releasing a freeze of the apparatus.

While the feedback amount of the DC feedback circuit is controlled in the manner as above, operation carried out by frequency analysis means to analyze the frequency of the Doppler deviated signal delivered out of the integrator is interrupted.

Accordingly, in accordance with the invention, the whole of a Doppler mode signal can be fed back negatively to the input of the integrator by means of the DC feedback circuit by an amount of a jump developing at the commencement of the Doppler mode, thereby cancelling out the jump of signal at the commencement of the Doppler mode. Strictly speaking, even in the present invention, continuity of signal cannot be obtained at the boundary between the B mode and the Doppler mode but when taking into consideration the fact that the Doppler deviated frequency of the signal of living body tissue occupying most part of signal components is sufficiently low, the continuity at the boundary between the B mode and Doppler mode is considered to be more eminent than that in the presence of the jump, thus ensuring that the occurrence of unwanted frequency components can be suppressed even when the DC feedback circuit is provided.

In addition, when the gate position where discontinuity of signal occurs, the gate width, the transmission pulse output signal or the mu-factor of receiving circuit is changed or when the freeze of the apparatus is released, the occurrence of unwanted frequencies can also be suppressed by suppressing the jump of signal through control of the feedback amount.

DESCRIPTION OF THE PREFERRED EMBODIMENTS

Embodiment 1

Figure 1:
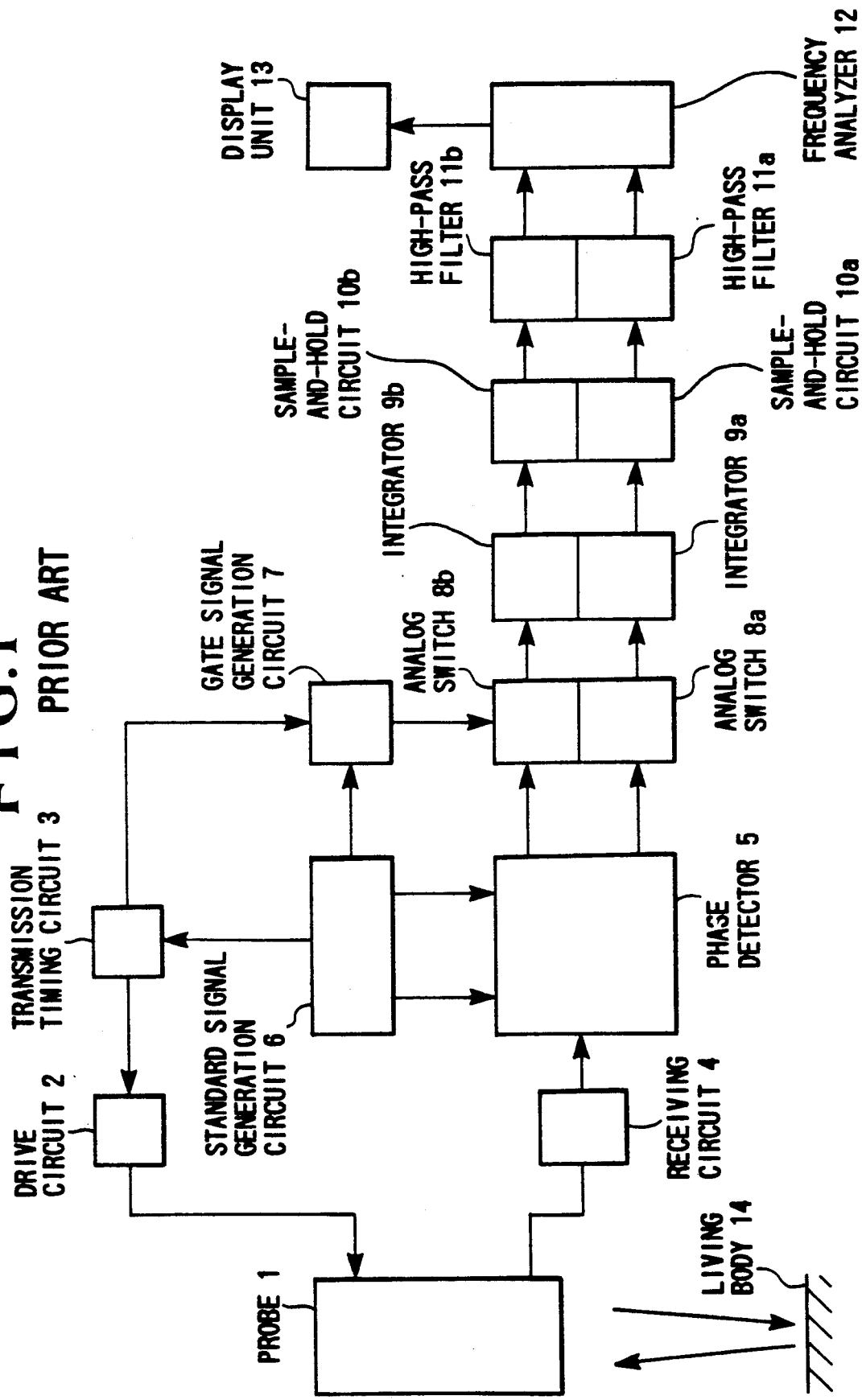
FIG. 1 is a functional block diagram showing a conventional ultrasonic Doppler blood-flow meter.
Figure 2:
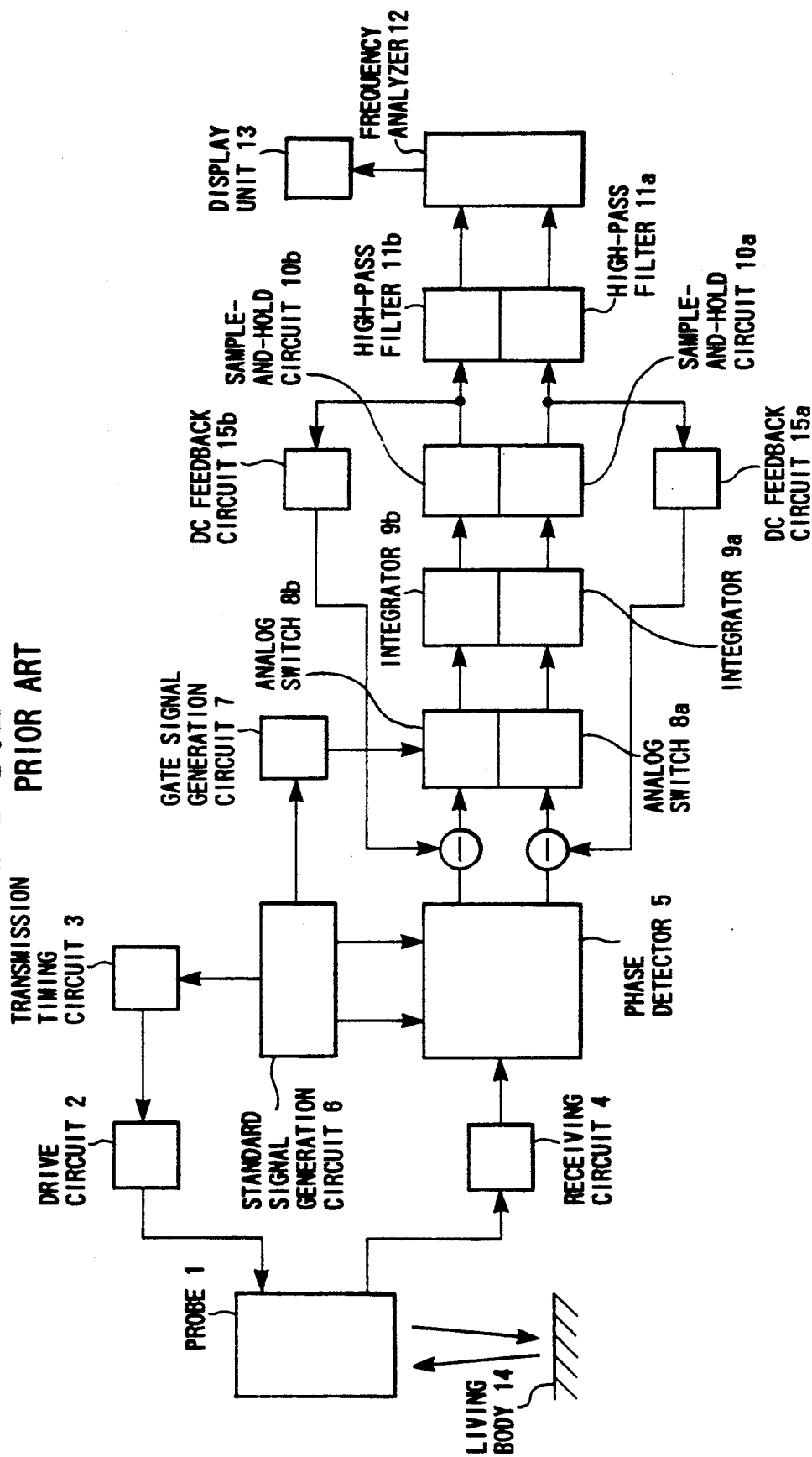
FIG. 2 is a functional block diagram showing another conventional ultrasonic Doppler blood-flow meter.
Figure 3:
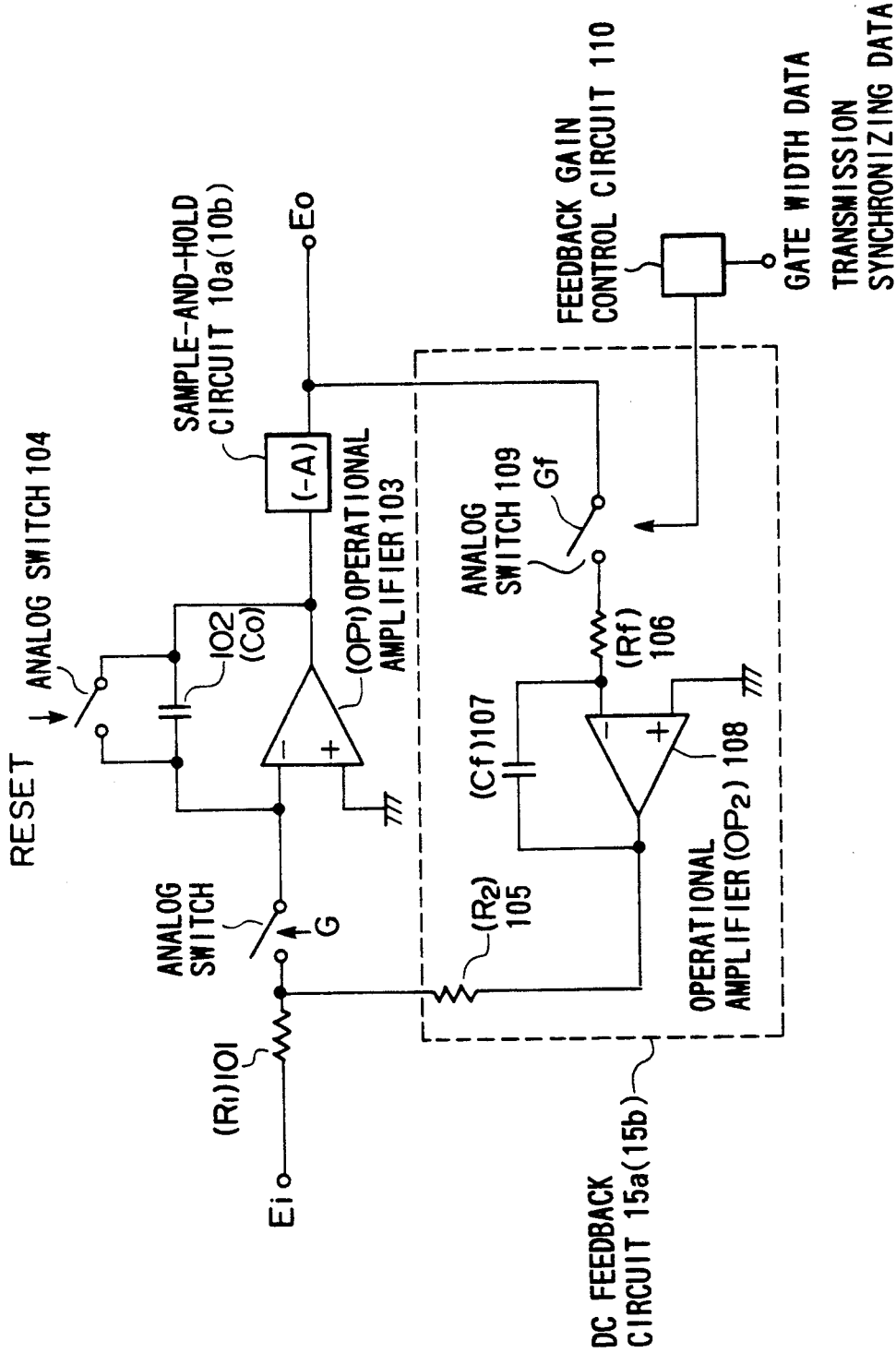
FIG. 3 is a circuit diagram of the essential part of the FIG. 2 example.
Figure 4:
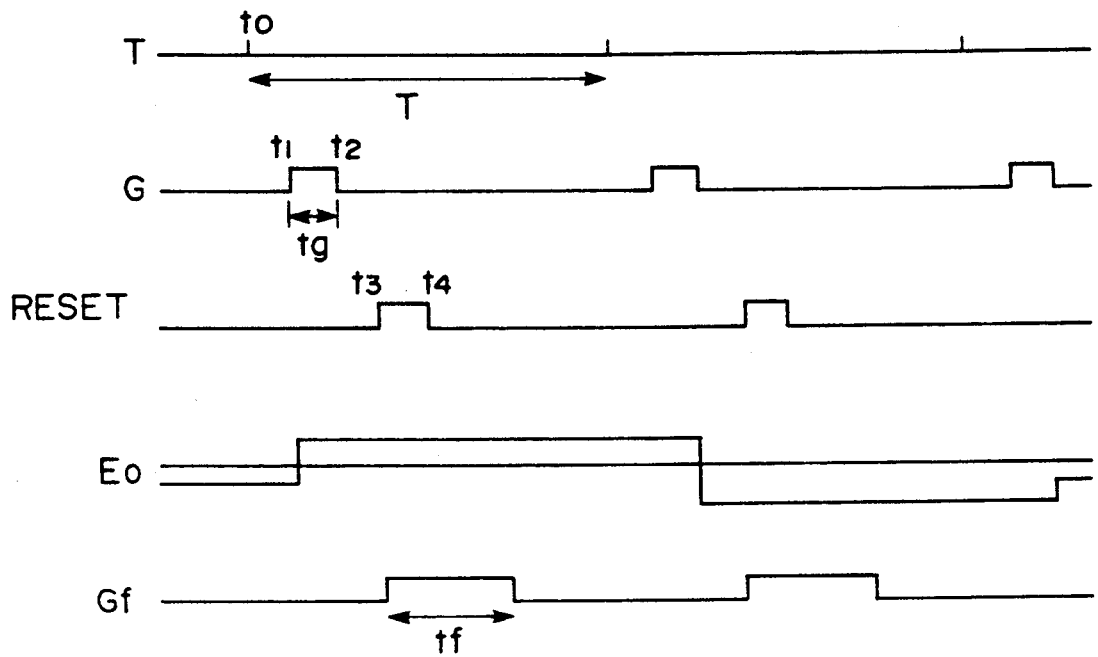
FIG. 4 is a timing chart for explaining the operation of the FIG. 2 example.
Figure 5:
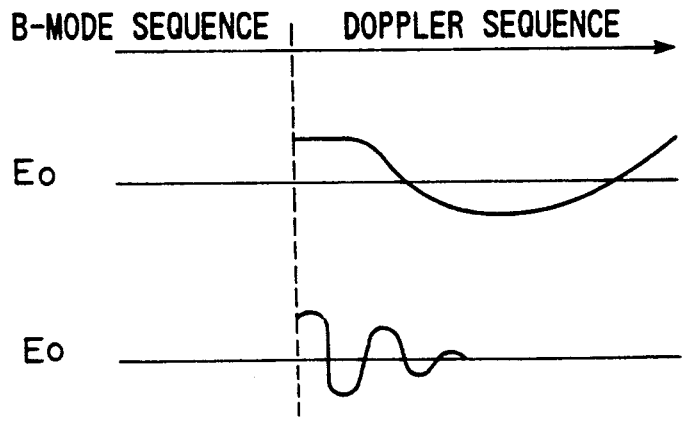
FIG. 5 is a diagram for explaining the output waveform of a sample-and-hold circuit in the FIG. 2 example.

A first embodiment of the invention will now be described with reference to the accompanying drawings. The present embodiment particularly has an integrator and a DC feedback circuit which are different from those of the prior art example described in connection with FIGS. 2 and 3 and therefore the structurally differing components are illustrated here with the omission of the remaining components.

Figure 6:
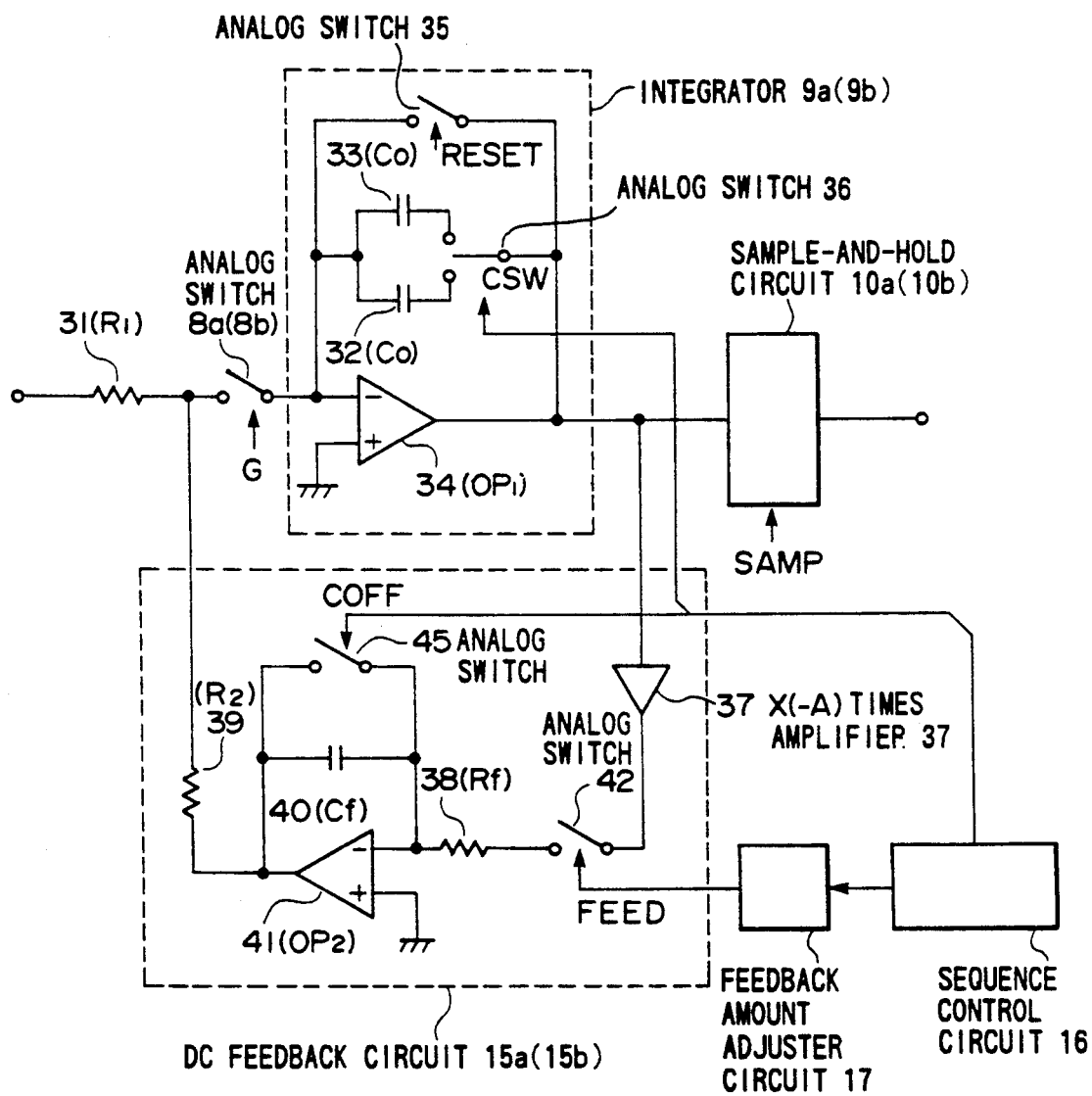
FIG. 6 is a circuit diagram of the essential part of an ultrasonic Doppler blood-flow meter according to a first embodiment of the invention.

Thus, FIG. 6 is a circuit diagram showing the essential part of an ultrasonic Doppler blood-flow meter according to the first embodiment of the invention.

Referring to FIG. 6, there are seen an analog switch 8a or 8b, an integrator 9a or 9b, a sample-and-hold circuit 10a or 10b, a DC feedback circuit 15a or 15b, a sequence control circuit 16 for B mode/Doppler mode, a feedback amount adjuster circuit 17 and a resistor (R1) 31. The integrator 9a or 9b includes a capacitor (Co) 32, a capacitor (Co') 33, an operational amplifier (OP1) 34 and analog switches 35 and 36. The DC feedback circuit 15a or 15b includes an amplifier 37 of −A times amplification, a resistor (Rf) 38, a resistor (R2) 39, a capacitor (Cf) 40 an operational amplifier (OP2) 41 and analog switches 42 and 43.

The operation of the above construction will now be described in detail.

Figure 7:
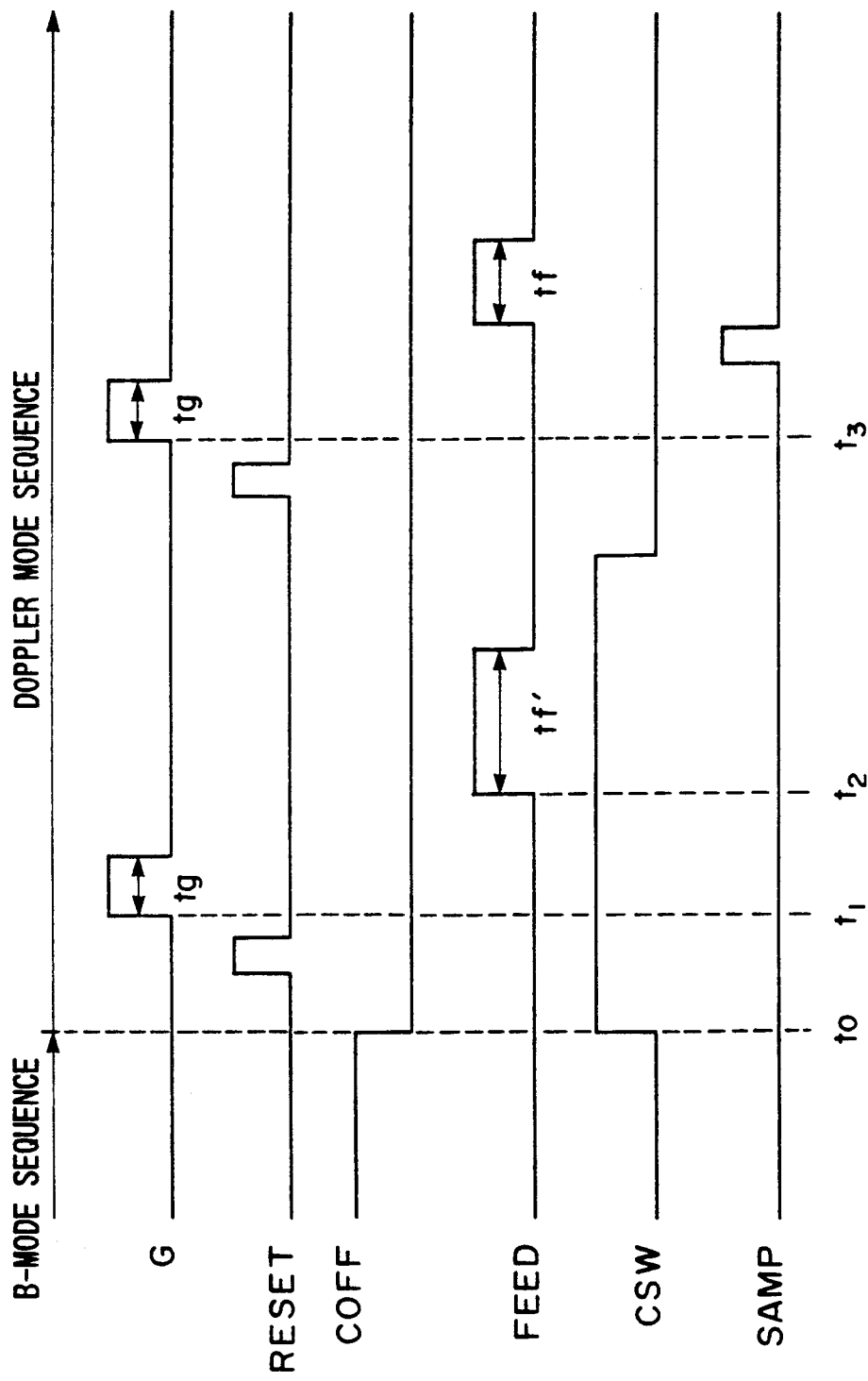
FIG. 7 is a timing chart in the serial Doppler mode of the ultrasonic Doppler blood-flow meter.

Firstly, the operation during the simultaneous Doppler mode based on the chopper scheme will be described with reference to a timing chart of FIG. 7.

During the B-mode sequence, the analog switch 43 of the DC feedback circuit 15a or 15b is turned on under the control of the sequence control circuit 16 to make null the charge on the capacitor (Cf) 40. When the sequence is switched from B mode to Doppler mode at time to, the analog switch 43 is turned off under the direction of the sequence control circuit 16. At time t1, a gate signal G is applied to the analog switch 8a or 8b to render it on, so that a phase-detected output signal is integrated by the integrator 9a or 9b. At that time, because of the absence of the output signal of DC feedback circuit 15a or 15b which is effective to cancel out DC and extremely frequency components, only the phase-detected output signal, that is, a large signal containing a clutter signal representative of an echo signal of a living body tissue is inputted to the integrator 9a or 9b. Therefore, to prevent the integrator 9a or 9b from being saturated under this condition, the analog switch 36 of integrator 9a or 9b is transferred, in advance under the control of the sequence control circuit 26, to the capacitor (co') 33 which is larger in capacitance than the ordinary capacitor (Co) 32. The integrated value stored in the capacitor (Co') 33 is a value not subjected to feedback and therefore this integrated value is not fetched into the sample-and-hold circuit 10a or 10b but it is −A times amplified by the amplifier 37 of the DC feedback circuit 15a or 15b and subsequently when the analog switch 42 is turned on at time t2 under the control of the sequence control circuit 16 by way of the feedback amount adjuster circuit 17, it is inputted to the capacitor (Cf) 40 and operational amplifier (OP2) 41. An width of time tf' for turn-on of the analog switch 42 is given by the following equation (7):

$$tf = \frac{C_o' \cdot C_f \cdot R_2 \cdot R_f}{A \cdot t_g} \quad (7)$$

Charge stored in the DC feedback circuit 15a or 15b has the same magnitude as that required for cancelling out the integrated value of the integrator 9a or 9b at time t1. Essentially, the Doppler deviated signal is in most part an echo signal from living body tissue which is of DC or ultra-low frequency and therefore the integrated value at time t1 is nearly equal to an integrated value at time t3 at which the gate is subsequently turned on following time t1. Accordingly, the integrated value of the phase-detected output signal at time t3 is almost cancelled out by DC feedback based on the integrated value at time t2. After time t2, the feedback amount to the DC feedback circuit 15a or 15b recovers a value for ordinary Doppler mode and the integrated value is fetched and held in the sample-and-hold circuit 10a or 10b.

Through the above operation, the jump of signal of large amplitude and high frequency components which results from the discontinuity of the Doppler sequence in the serial Doppler type based on the chopper scheme can be suppressed.

Now, an operation will be described in which the gate position is moved by indicating an area of interest in a B-mode image by means of a gate marker while displaying a Doppler spectrum in real time.

When the position of the gate marker is moved, the analog switch 8a or 8b for gating is actuated in the ordinary manner in the prior art but contrarily, in the present embodiment, the gating analog switch 8a or 8b is kept to be off under the control of the control circuit 16 to prevent passage of signal during movement of the gate. Immediately after completion of movement of the gate, the gating analog switch 8a or 8b is turned on as usual under the control of the control circuit 16, allowing the integrator 9a or 9b to integrate data of phase-detected output signal. Since there is a time delay between the phase-detected signal immediately after gate movement and that immediately before gate movement, these two signals are mutually discontinuous. If the discontinuous data is inputted to the succeeding high-pass filter 11a or 11b, then unwanted frequency components will be generated. Occurrence of such components must be prevented. The circuit shown in FIG. 6 is not limited to the aforementioned suppression of the jump of signal due to the discontinuity of the Doppler mode in the simultaneous Doppler type but is also applicable to the movement of gate position also conditioned by the discontinuity of signal, whereby the B-mode period in FIG. 7 can substitute directly for the gate moving period and a Doppler deviated signal immediately after completion of the gate movement can be fed back negatively to the input of the integrator 9a or 9b to prevent the occurrence of unwanted frequency components when the gate movement is carried out. The frequency analyzer 12 is so controlled by the control circuit 16 as not to perform operations, thus preventing unwanted spectrum data from being displayed on the display unit 13.

Embodiment 2

A second embodiment of the invention will now be described with reference to the accompanying drawing.

Figure 8:
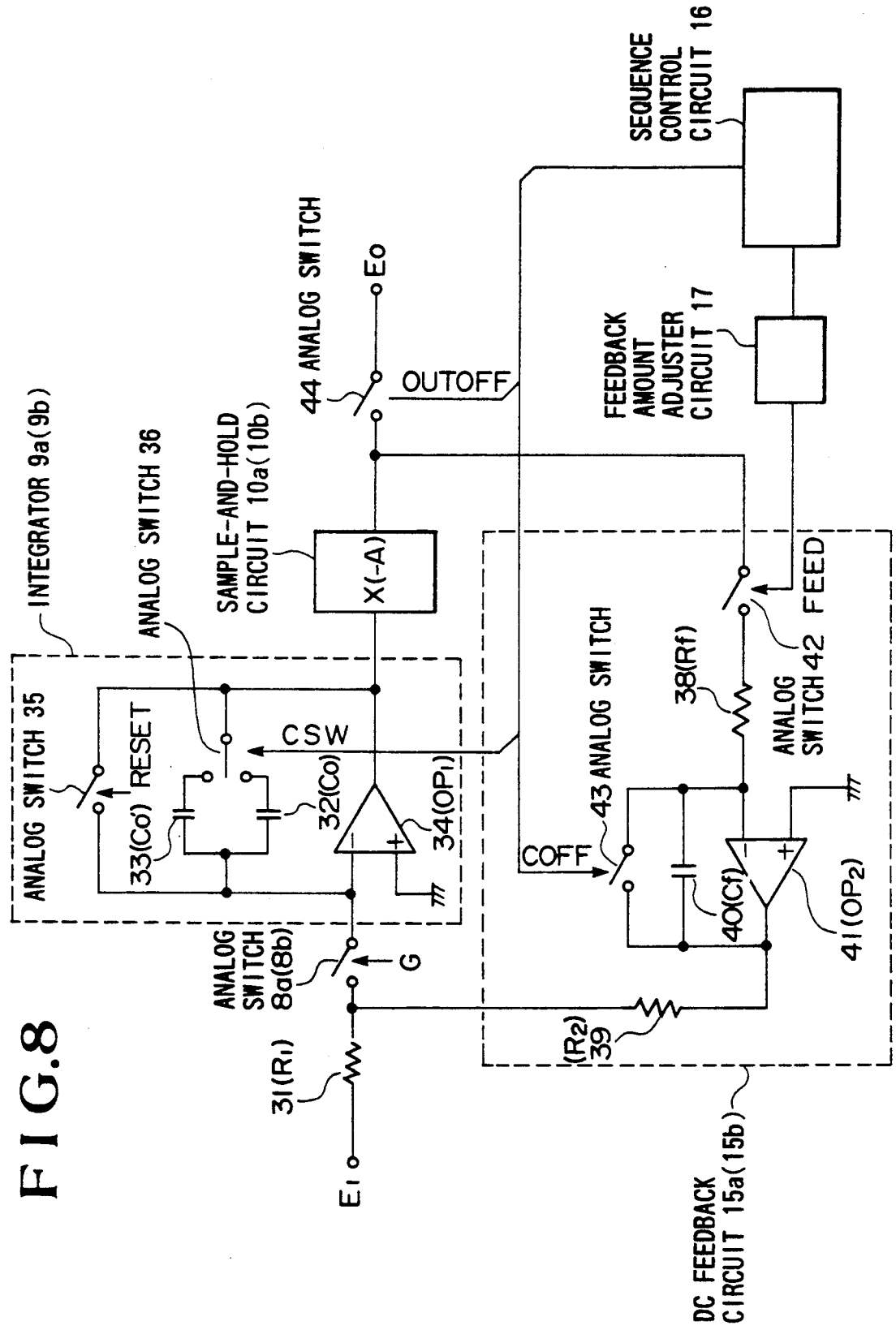
FIG. 8 is a circuit diagram of the essential part of an ultrasonic Doppler blood-flow meter according to a second embodiment of the invention.

FIG. 8 is a circuit diagram showing the essential part of an ultrasonic Doppler blood-flow meter according to the second embodiment of the invention.

As shown in FIG. 8, the present embodiment is so constructed that the integrated value of an integrator 9a or 9b is fetched and held in a sample-and-hold circuit 10a or 10b and thereafter inputted to a DC feedback circuit 15a or 15b. The sample-and-hold circuit 10a or 10b holds an integrated value of a signal not subjected to feedback at time t1 and therefore during delivery of the integrated value from the sample-and-hold circuit 10a or 10b, an analog switch 44 is turned off under the control of a sequence control circuit 16 to prevent the signal from being applied to the succeeding stage. The remaining components are the same as those of the first embodiment.

Embodiment 3

A third embodiment of the invention will now be described with reference to the accompanying drawing.

Figure 9:
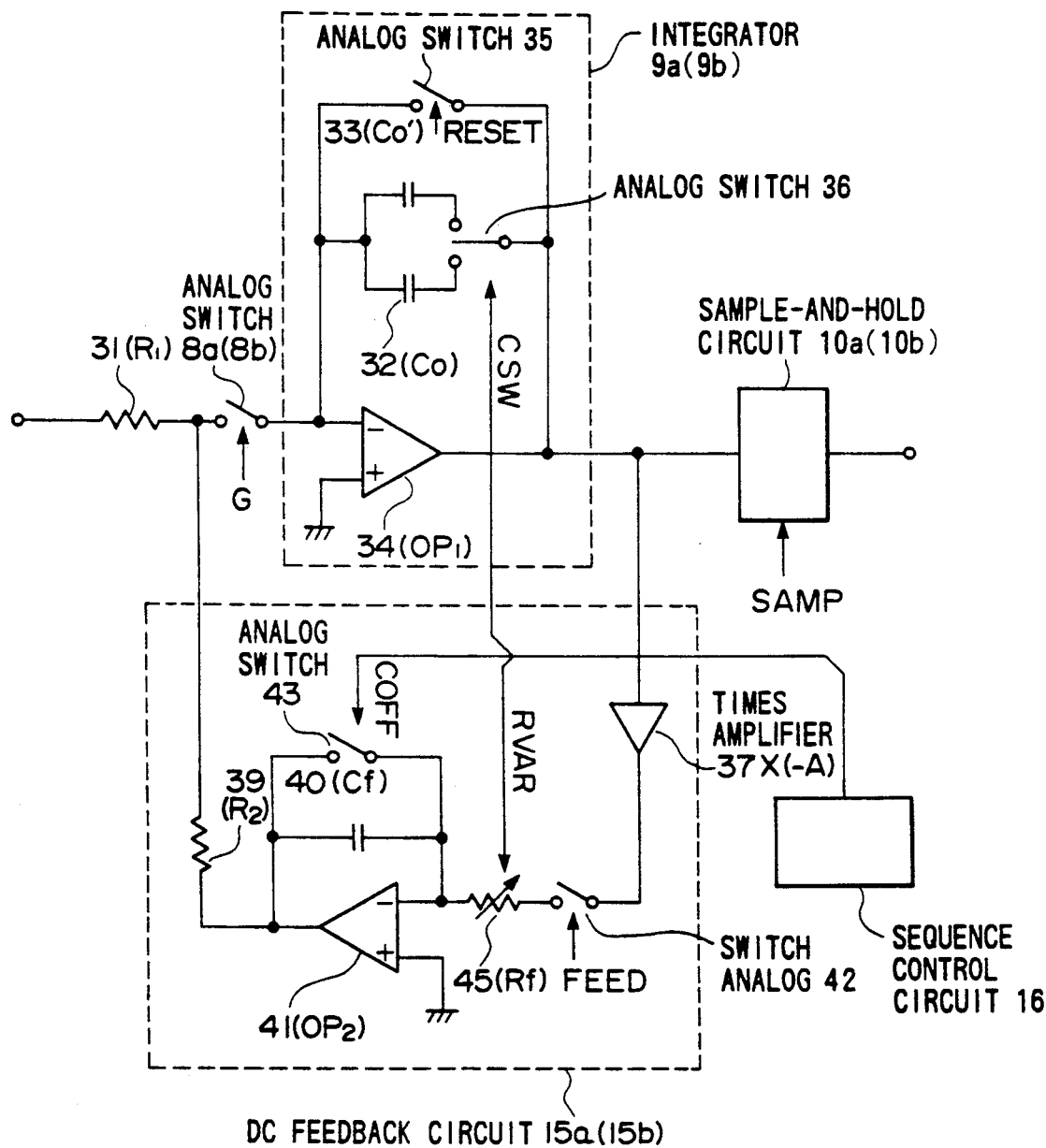
FIG. 9 is a circuit diagram of the essential part of an ultrasonic Doppler blood-flow meter according to a third embodiment of the invention.

FIG. 9 is a circuit diagram showing the essential part of an ultrasonic Doppler blood-flow meter according to the third embodiment of the invention.

In the first embodiment, the feedback amount to the DC feedback circuit 15a or 15b is changed by changing the length of time interval tf during which the analog switch is turned on but the present embodiment is so constructed that the feedback amount is adjusted by changing the resistance of a variable input resistor (Rf) 45 of a DC feedback circuit 15a or 15b. The remaining components are the same as those of the first embodiment.

Embodiment 4

A fourth embodiment of the invention will now be described with reference to the accompanying drawing.

Figure 10:
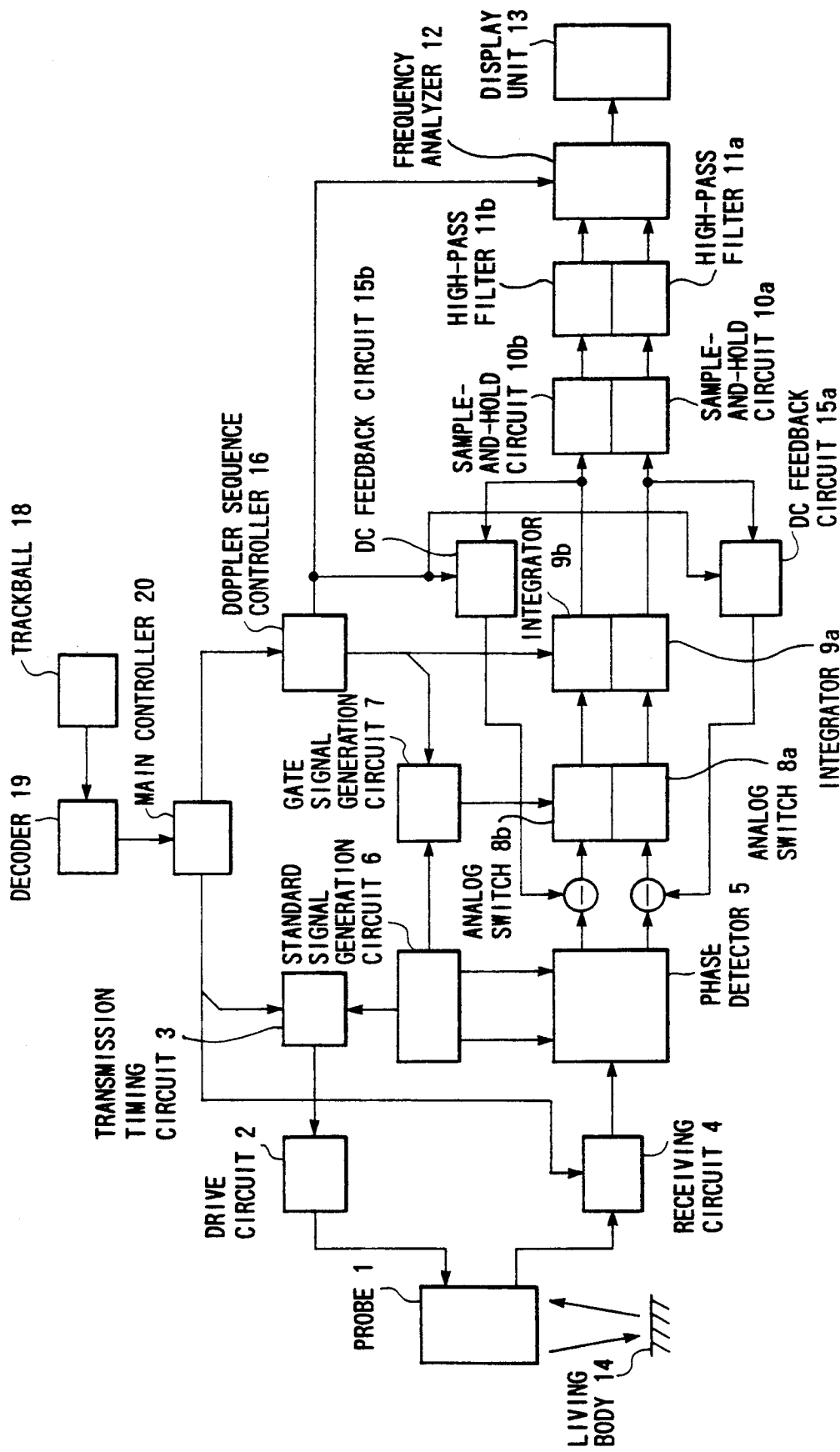
FIG. 10 is a functional block diagram showing an ultrasonic Doppler blood-flow meter according to a fourth embodiment of the invention.

FIG. 10 is a functional block diagram showing an ultrasonic Doppler blood-flow meter according to the fourth embodiment of the invention.

The present embodiment is directed to prevention of generation of unwanted frequency components when the gate position is changed. Referring to FIG. 10, there are seen the same components as those of the foregoing embodiments including a probe 1, a drive circuit 2, a transmission timing circuit 3, a receiving circuit 4, a phase detector 5, a reference signal generator 6, a gate signal generation circuit 7, analog switches 8a and 8b, integrators 9a and 9b, sample-and-hold circuits 10a and 10b, high-pass filters 11a and 11b, a frequency analyzer 12, a display unit 13, DC feedback circuits 15a and 15b and a Doppler sequence controller 16. The present embodiment further comprises a trackball 18 for inputting gate positions, a decoder 19 for the trackball and a main controller 20.

The operation of the above construction will now be described.

A pulse signal generated by the drive circuit 2 using a signal generated from the transmission timing circuit 3 as a trigger is converted by the probe 1 into an ultrasonic pulse signal which in turn is transmitted into a living body 14. The ultrasonic pulse signal is then reflected at a portion of living body 14 at which the acoustic impedance changes. The reflected signal is converted by the probe 1 into an electrical signal which in turn is amplified by the receiving circuit 4 to a suitable extent and is then subjected to phase detection by the phase detector 5. The above operation is the same as that of the first embodiment. Further, provided that the gate position is not changed, the operation of the components following the analog switches 8a and 8b is the same as that of the first embodiment.

When the gate position is changed during operation, the apparatus of the present embodiment operates as will be described below. A change in gate position is inputted by means of the trackball 18 and a rotation angle of the trackball is converted by the decoder 19 into data representative of gate position change. The main controller 209 receiving the gate position change data sends to the Doppler sequence controller 16 information to the effect that the gate position is shifted, so that the Doppler sequence controller 16 performs the same control as that carried out in the B mode in the serial Doppler type to prevent display of unnecessary images. When movement of the trackball 18 ends and a new gate position is settled, the main controller 20 receiving gate position data from the decoder 19 causes the transmission timing circuit 3 and receiving circuit 4 to change the beam direction and at the same time sends new gate position data to the Doppler sequence controller 16. Then, the Doppler sequence controller 16 sends the gate position data to the gate signal generation circuit 7 which in turn permits the same sequence control as that carried out at the termination of the B mode in the previously-described first embodiment. In this manner, the generation of unwanted frequency components concomitant with gate movement can be prevented.

Embodiment 5

A fifth embodiment of the invention will now be described with reference to the accompanying drawing.

Figure 11:
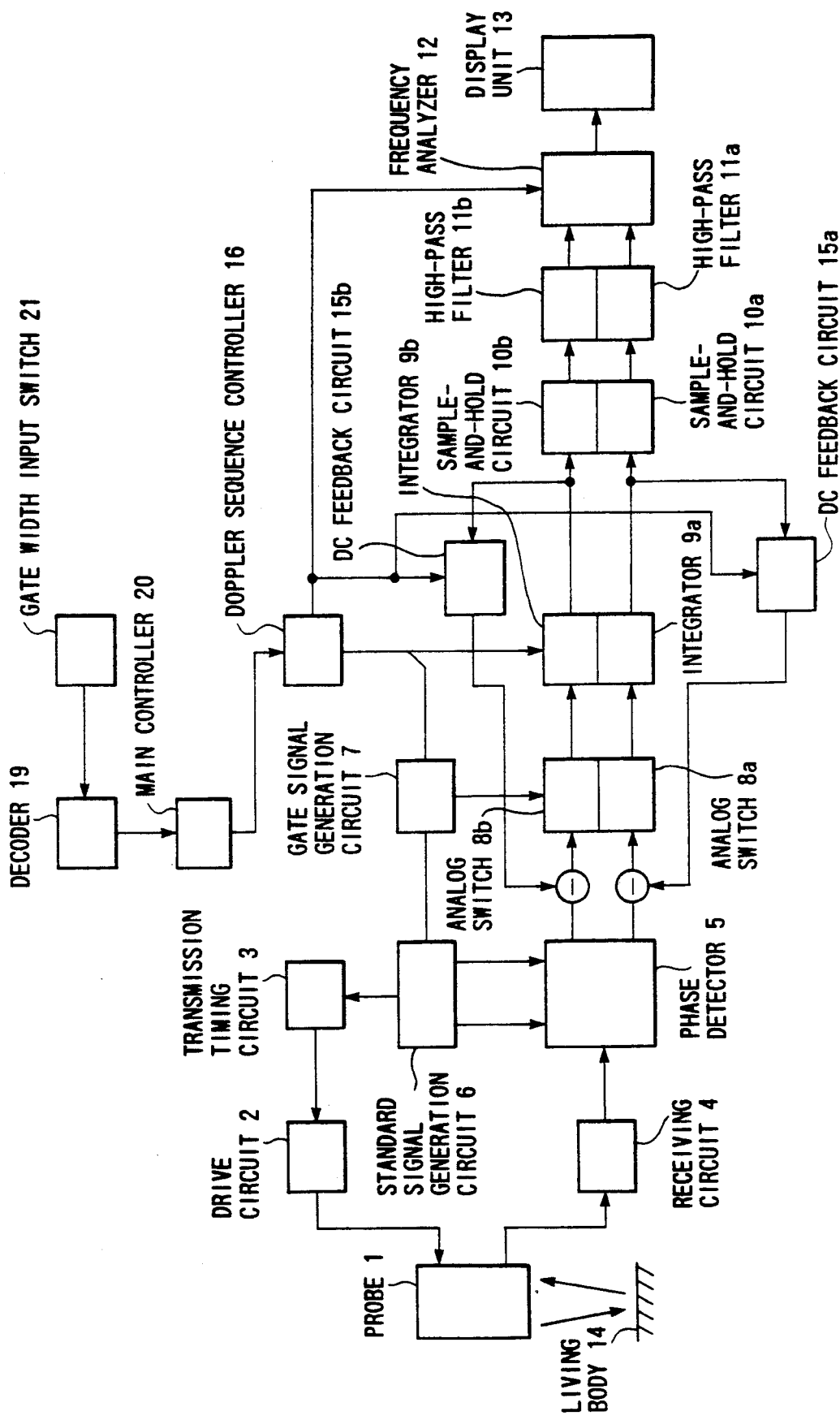
FIG. 11 is a functional block diagram showing an ultrasonic Doppler blood-flow meter according to a fifth embodiment of the invention.

FIG. 11 is a functional block diagram showing an ultrasonic Doppler blood-flow meter according to the fifth embodiment of the invention.

The present embodiment is directed to prevention of the occurrence of unwanted frequency components when the gate width is changed.

Structurally, the present embodiment differs from the fourth embodiment shown in FIG. 10 in that a gate width input switch 21 for setting gate widths is provided as shown in FIG. 11. The remaining components are the same as those of the fourth embodiment, which are designated by identical reference numerals, and will not be described here.

The present embodiment having the above construction operates in a different manner from the fourth embodiment as will be described below.

When a change in gate width is inputted by means of the switch 21, the gate width change is sent to a main controller 20 through a decoder 19. The main controller 20 sends to a Doppler sequence controller 16 information to the effect that the gate width is changed, so that the Doppler sequence controller 16 prevents display of unnecessary images and at the same time controls integrators 9a and 9b, sample-and-hold circuits 10a and 10b and DC feedback circuits 15a and 15b similarly to control carried out at the termination of B mode in the serial Doppler type. Through the above operation, the generation of unwanted frequency components concomitant with change of gate width can be prevented.

Embodiment 6

A sixth embodiment of the invention will now be described with reference to the accompanying drawings.

Figure 12:
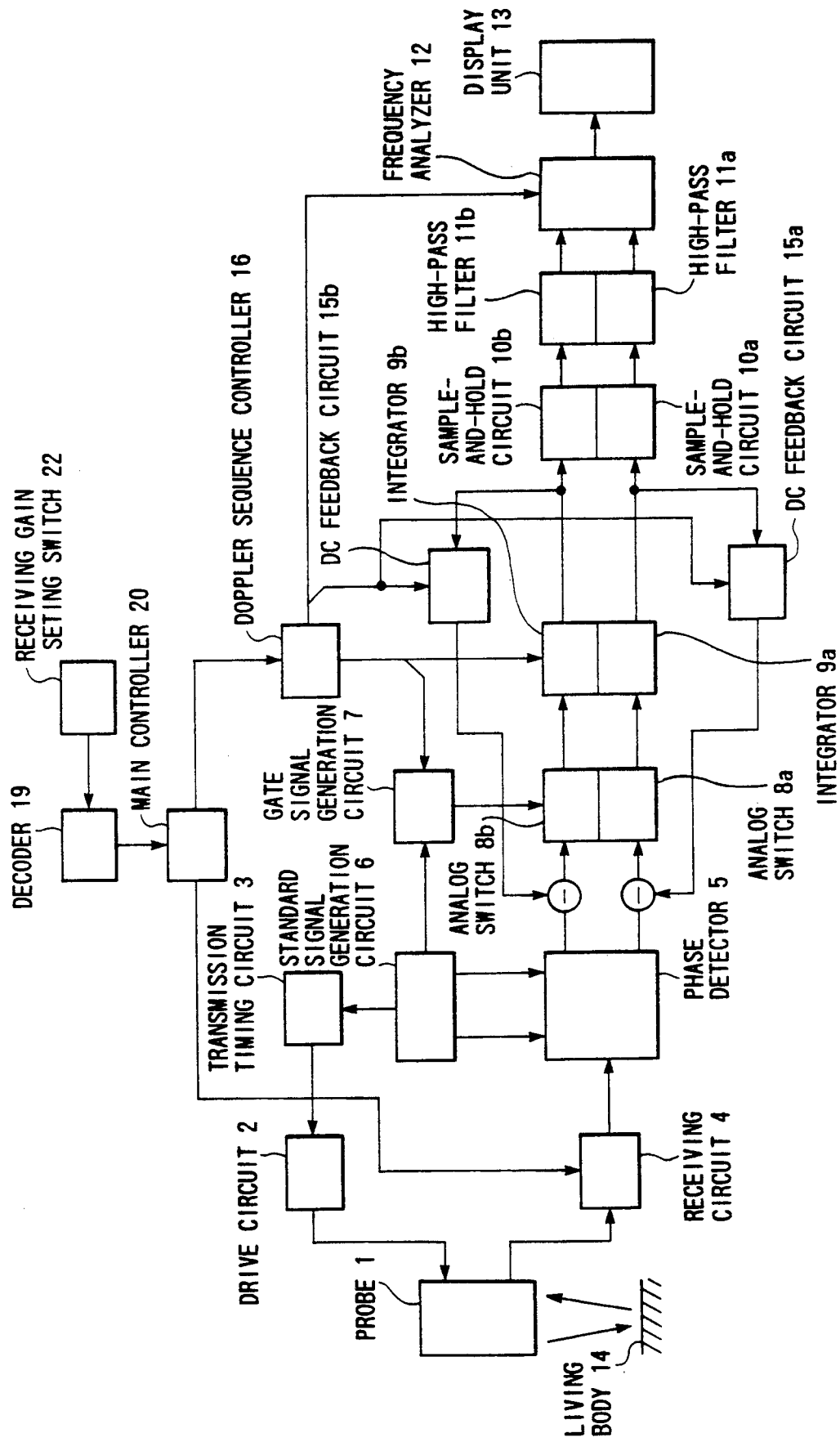
FIG. 12 is a functional block diagram showing an ultrasonic Doppler blood-flow meter according to a sixth embodiment of the invention.

1 FIG. 12 is a functional block diagram showing an ultrasonic blood-flow meter according to the sixth embodiment of the invention.

The present embodiment is directed to prevention of generation of unwanted frequency components when the receiving gain is changed.

Structurally, the present embodiment differs from the fourth embodiment shown in FIG. 10 in that a switch 22 for setting receiving gains is provided as shown in FIG. 12. The remaining components are the same as those of the fourth embodiment, which are designated by identical reference numerals, and will not be described herein.

The present embodiment having the above construction operates in a different manner from the fourth embodiment as will be described below.

Figure 13:
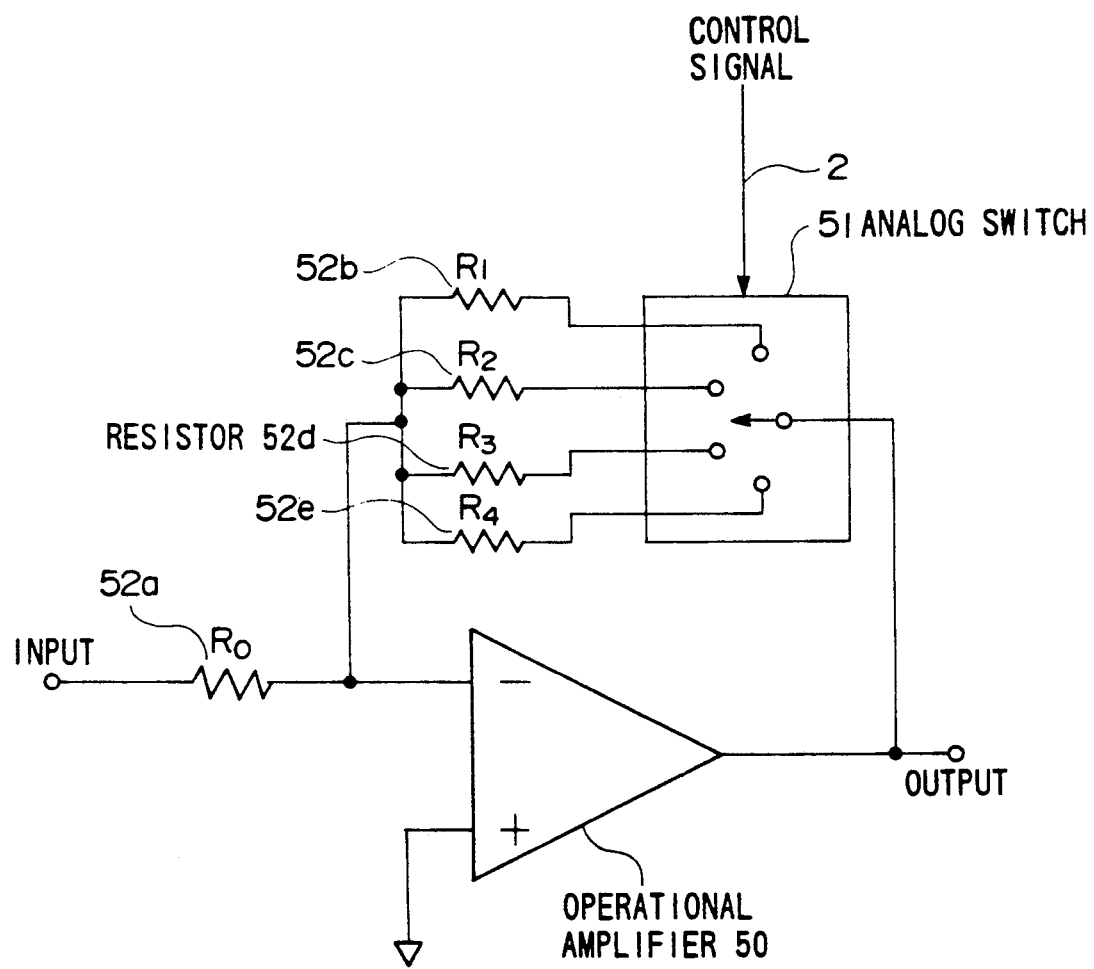
FIG. 13 is a circuit diagram showing an example of a discretely variable gain amplifier.

Generally, in the ultrasonic Doppler blood-flow meter, the receiving gain can be changed by the receiving circuit 4 but the recent trend is such that an analog switch as shown in FIG. 13 is used in a gain change section and is transferred remotely from the operator section. In FIG. 13, there are provided an operational amplifier 50, an analog switch 51 and resistors 52a to 52e. The analog switch 51 controllable through a control line of 2 bits is responsive to a digital signal to discretely adjust the gain. In the ultrasonic Doppler blood-flow meter having the above construction, the receiving gain is changed discretely and therefore discontinuity takes place in a Doppler deviated signal at a timing that the receiving gain is switched over, resulting in display of unwanted spectra. Thus, in accordance with the present embodiment, when a change in receiving gain is inputted by means of the receiving gain setting switch 22, a gate signal generation circuit 7 receives receiving gain change data through decoder 19, main controller 20 and Doppler sequence controller 16 and causes analog switches 8a and b to be normally turned off in order that an output signal delivered out of a phase detector 5 during the gain change is cut, and the Doppler sequence controller 6 stops a frequency analyzer 12 from producing an output signal so as to prevent unwanted display. Immediately after completion of the receiving gain change, the present embodiment operates similarly to the foregoing first embodiment.

Embodiment 7

A seventh embodiment of the present invention will now be described with reference to the accompanying drawing.

Figure 14:
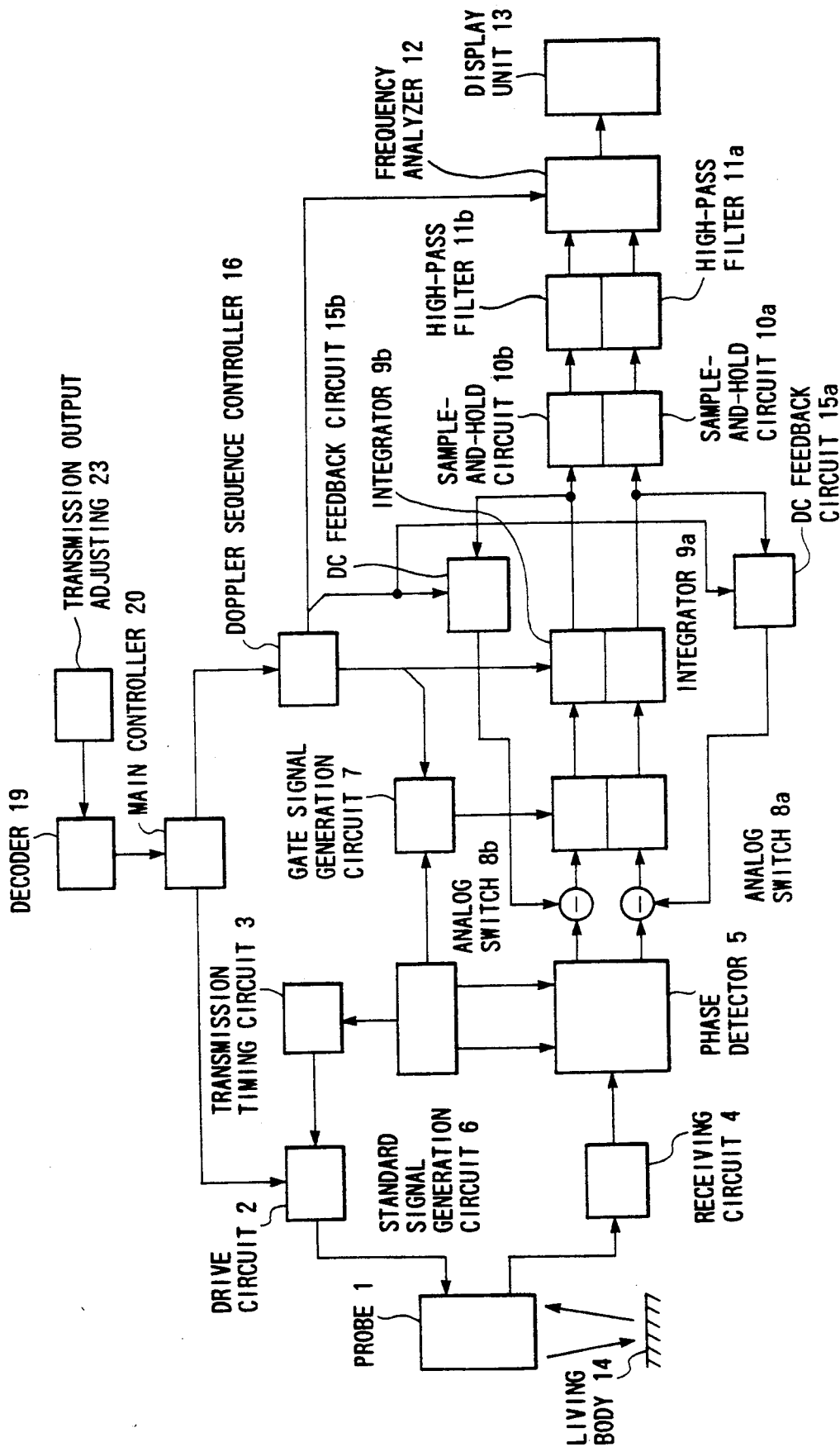
FIG. 14 is a functional block diagram showing an ultrasonic Doppler blood-flow meter according to a seventh embodiment of the invention.

FIG. 14 is a functional block diagram showing an ultrasonic Doppler blood-flow meter according to the seventh embodiment of the invention.

The present embodiment contemplates prevention of the occurrence of unwanted frequency components when the transmission output is changed.

Structurally, the present embodiment differs from the fourth embodiment shown in FIG. 10 in that a transmission output adjusting switch 23 for adjusting the transmission output is provided as shown in FIG. 14. The remaining components are the same as those of the fourth embodiment, which are designated by identical reference numerals, and will not be described here.

The present embodiment having the above construction operates in a different manner from the fourth embodiment as will be described below.

A pulse signal is generated by a drive circuit 2 which uses a signal from a transmission timing circuit 3 as a trigger, and the delivery of the pulse signal is controlled by a value inputted by means of the switch 23.

The operation when the transmission output is changed will now be described. When a change in transmission output is inputted by means of the transmission output adjusting switch 23, a gate signal generation circuit 7 receives transmission output change data through decoder 19, main controller 20 and Doppler sequence controller 16 and normally turns off analog switches 8a and 8b in order to cut an output signal delivered out of a phase detector 5 during the change of transmission output and at the same time the Doppler sequence controller 16 stops a frequency analyzer 12 from delivering an output signal to prevent unnecessary display. Immediately after completion of the transmission output change, the present embodiment operates similarly to the foregoing first embodiment.

Embodiment 8

An eighth embodiment of the invention will now be described with reference to the accompanying drawing.

Figure 15:
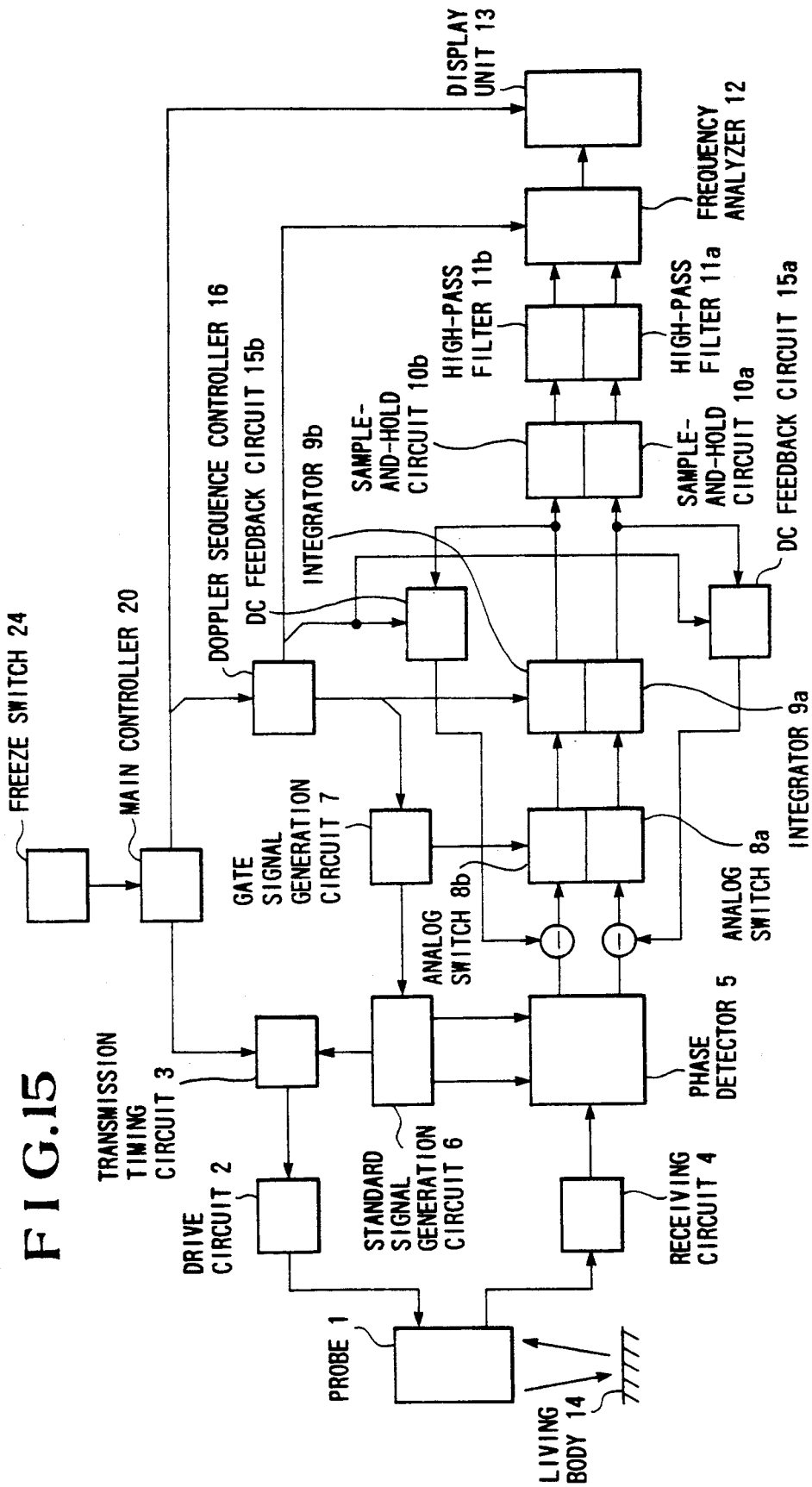
FIG. 15 is a functional block diagram showing an ultrasonic Doppler blood-flow meter according to an eighth embodiment of the invention.

FIG. 15 is a functional block diagram showing an ultrasonic blood-flow meter according to the eighth embodiment of the invention.

The present embodiment contemplates prevention of the occurrence of unwanted frequency components when a freeze of the apparatus is released.

Structurally, the present embodiment differs from the fourth embodiment shown in FIG. 10 in that a freeze switch 24 for setting and release of freeze is provided as shown in FIG. 15. The remaining components are the same as those of the fourth embodiment, which are designated by identical reference numerals, and will not be described herein.

The present embodiment having the above construction operates in a different manner from the fourth embodiment as will be described below.

When the operation of the apparatus is desired to be stopped temporarily to freeze the image display, display of transmission/reception images can all be stopped by operating the switch 24. When the freeze is released, the apparatus recovers the same operation as that carried out when the B mode is switched to the Doppler mode in the first embodiment.

The fourth to eighth embodiments have been described as using the circuit of the first embodiment but they may be realized with the circuits of the second and third embodiments.

We claim:

1. An ultrasonic blood-flow meter, adapted for use in a combined B-mode and Doppler measurement and display system, comprising:
    means for transmitting an ultrasonic pulse signal into a living body and receiving an echo signal reflected within said living body;
    phase detection means for detecting the phase of the echo signal;
    means for selecting a gated part of a phase-detected signal;
    an integrator for integrating the selected phase-detected signal;
    a DC feedback circuit for negatively feeding back a DC component and a low-frequency component contained in a Doppler deviated signal produced from said integrator to the input thereof; and
    control means, adapted to receive an input representative of mode switching, for changing, in response to said input, the feedback amount of said DC feedback circuit between non-zero levels in synchronism with switching between a B-mode transmission/reception sequence and a Doppler mode sequence.

2. An ultrasonic Doppler blood-flow meter according to claim 1 further comprising a sample-and-hold circuit following said integrator wherein an output signal of said integrator is held by said sample-and-hold circuit and inputted to said DC feedback circuit.

3. An ultrasonic blood-flow meter, adapted for use in a combined B-mode and Doppler measurement and display system, comprising:
    means for transmitting an ultrasonic pulse signal into a living body and receiving an echo signal reflected within said living body;
    phase detection means for detecting the phase of the echo signal;

means for selecting a gated part of a phase-detected signal;

an integrator for integrating the selected phase-detected signal;

a DC feedback circuit for negatively feeding back a DC component and a low-frequency component contained in a Doppler deviated signal produced from said integrator to an input thereof; and control means, adapted to receive an input representative of a gate position change, for changing, in response to said input, the feedback amount of said DC feedback circuit between non-zero levels, wherein the feedback amount is different for gate position changing and a Doppler mode.

4. An ultrasonic Doppler blood-flow meter according to claim 3 further cmprising a sample-and-hold circuit following said integrator wherein an output signal of said integrator is held by said sample-and-hold circuit and inputted to said DC feedback circuit.

5. An ultrasonic blood-flow meter, adapted for use in a combined B-mode and Doppler measurement and display system, comprising:

means for transmitting an ultrasonic pulse signal into a living body and receiving an echo signal reflected within said living body;

amplifier means for amplifying the received echo signal, said amplifier means having a plurality of discrete selectable gain values;

phase detection means for detecting the phase of the amplifier echo signal;

means for selecting a gated part of a phase-detected signal;

an integrator for integrating the selected phase-detected signal;

a DC feedback circuit for negatively feeding back a DC component and a low-frequency component contained in a Doppler deviated signal produced from said integrator to the input thereof; and control means, adapted to receive an input representative of an amplifier means gain change, for changing, in response to said input, the feedback amount of said DC feedback circuit during the time that the gain of said amplifier means is changed and immediately after changing the amplifier means gain.

6. An ultrasonic Doppler blood-flow meter according to claim 5 further comprising a sample-and-hold circuit following said integrator wherein an output signal of said integrator is held by said sample-and-hold circuit and inputted to said DC feedback circuit.

7. An ultrasonic blood-flow meter, adapted for use in a combined B-mode and Doppler measurement and display system, comprising:

means for transmitting an ultrasonic pulse signal into a living body and receiving an echo signal reflected within said living body, including drive means for producing a selected ultrasonic pulse signal transmission output;

phase detection means for detecting the phase of the echo signal;

means for selecting a gated part of a phase-detected signal;

an integrator for integrating the selected phase-detected signal;

a DC feedback circuit for negatively feeding back a DC component and a low-frequency component contained in a Doppler deviated signal produced from said integrator to the input thereof; and control means, adapted to receive an input representative of a transmission output change, for changing, in response to said input, the feedback amount of said DC feedback circuit during the time that the pulse signal transmission output is changed and the time immediately after changing the pulse signal transmission output.

8. An ultrasonic Doppler blood-flow meter according to claim 7 further comprising a sample-and-hold circuit following said integrator wherein an output signal of said integrator is held by said sample-and-hold circuit and inputted to said DC feedback circuit.

9. An ultrasonic blood-flow meter, adapted for use in a combined B-mode and Doppler measurement and display system including display means, comprising:

means for transmitting an ultrasonic pulse signal into a living body and receiving an echo signal reflected within said living body, including transmission timing means for controlling production of said ultrasonic pulse signal;

phase detection means for detecting the phase of the echo signal;

means for selecting a gated part of a phase-detected signal;

an integrator for integrating the selected phase-detected signal;

a DC feedback circuit for negatively feeding back a DC component and a low-frequency component contained in a Doppler deviated signal produced from said integrator to the input thereof; and control means, adapted to receive an input representative of a freeze operation, for changing, in response to said input, the feeuback amount of said DC feedback circuit immediately after terminating the freeze operation.

10. An ultrasonic Doppler blood-flow meter according to claim 9 further comprising a sample-and-hold circuit following said integrator wherein an output signal of said integrator is held by said sample-and-hold circuit and inputted to said DC feedback circuit.

* * * * *